United States Patent
Miyazaki et al.

(10) Patent No.: US 10,749,437 B2
(45) Date of Patent: Aug. 18, 2020

(54) POWER CONVERSION DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Masaru Miyazaki, Kariya (JP); Tomohisa Sano, Kariya (JP); Kentaro Hirose, Okazaki (JP)

(73) Assignees: DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/393,231

(22) Filed: Apr. 24, 2019

(65) Prior Publication Data

US 2019/0334440 A1 Oct. 31, 2019

(30) Foreign Application Priority Data

Apr. 26, 2018 (JP) .................. 2018-085322

(51) Int. Cl.
*H02M 7/00* (2006.01)
*H02M 3/158* (2006.01)
(Continued)

(52) U.S. Cl.
CPC ....... *H02M 3/1588* (2013.01); *H02M 3/1582* (2013.01); *H02M 7/003* (2013.01);
(Continued)

(58) Field of Classification Search
CPC .. H02M 3/1588; H02M 3/1582; H02M 3/158; H02M 2001/007; H02M 2001/322;
(Continued)

(56) References Cited

U.S. PATENT DOCUMENTS

| 2013/0272043 | A1* | 10/2013 | Sano | ............. | H02M 7/003 |
| | | | | | 363/123 |
| 2015/0292511 | A1* | 10/2015 | Sakai | ............. | H02K 7/14 |
| | | | | | 417/423.1 |
| 2018/0281605 | A1 | 10/2018 | Sawazaki et al. | | |

FOREIGN PATENT DOCUMENTS

| JP | 2016-073096 A | 5/2016 |
| JP | 2018-137918 A | 8/2018 |

(Continued)

*Primary Examiner* — Bryan R Perez
(74) *Attorney, Agent, or Firm* — Oliff PLC

(57) ABSTRACT

A power conversion device has semiconductor modules, a cooling unit, a capacitor module, a discharge resistance substrate, a control circuit substrate and a casing. The semiconductor modules from a power conversion circuit. The capacitor module is electrically connected to the semiconductor module. The discharge resistance is arranged on the discharge resistance substrate, and electrically discharges the capacitor module. The control circuit substrate controls operation of the semiconductor modules. The casing accommodates the semiconductor module, the cooling unit, the capacitor module, the discharge resistance substrate and the control circuit substrate. The discharge resistance substrate is arranged between an outer wall surface of the capacitor module and the control circuit substrate and arranged in a direction perpendicular to the control circuit substrate so that the discharge resistance substrate is separated in position from the outer wall surface of the capacitor module and the control circuit substrate.

8 Claims, 6 Drawing Sheets

(51) Int. Cl.
　　*H02M 1/32*　　　(2007.01)
　　*H02M 7/5387*　　(2007.01)
(52) U.S. Cl.
　　CPC .... *H02M 7/5387* (2013.01); *H02M 2001/327*
　　　　　　(2013.01); *Y10T 29/53278* (2015.01)
(58) Field of Classification Search
　　CPC .. H05K 7/20927; H05K 7/1432; H05K 7/003;
　　　　　　H05K 7/5387; Y10T 29/53278
　　See application file for complete search history.

(56) References Cited

FOREIGN PATENT DOCUMENTS

| | | |
|---|---|---|
| JP | 2018-142661 A | 9/2018 |
| JP | 2018-207664 A | 12/2018 |
| JP | 2019-062077 A | 4/2019 |
| JP | 2019-062651 A | 4/2019 |
| JP | 2019-092329 A | 6/2019 |
| JP | 2019-103280 A | 6/2019 |
| JP | 2019-103282 A | 6/2019 |
| JP | 2019-106753 A | 6/2019 |
| JP | 2019-106755 A | 6/2019 |
| JP | 2019-129225 A | 8/2019 |
| JP | 2019-146409 A | 8/2019 |
| JP | 2019-176693 A | 10/2019 |
| WO | 2018/198883 A1 | 11/2018 |

\* cited by examiner

POWER CONVERSION DEVICE

CROSS-REFERENCE TO RELATED APPLICATION

This application is related to and claims priority from Japanese Patent Application No. 2018-85322 filed on Apr. 26, 2018, the contents of which are hereby incorporated by reference.

TECHNICAL FIELD

The present disclosure relates to power conversion devices.

BACKGROUND

A power conversion device is mounted on various types of vehicles, e.g. on hybrid vehicles and electric vehicles so as to drive electric motors, etc. For example, an electric motor is generally equipped with semiconductor modules forming an inverter, a cooling unit through which a coolant flows, a capacitor module including a smoothing capacitor, a circuit board and a casing. The casing accommodates the semiconductor modules, the inverter, the cooling unit, the capacitor module, the circuit board, etc. In general, various attempts have been made so as to reduce an overall size of the casing. For example, an attempt has been made to ensure optimum structure and arrangement of the semiconductor modules, the capacitor module, the inverter, the cooling unit and the circuit board in the casing.

SUMMARY

An exemplary embodiment of the present disclosure provides a power conversion device with a compact size having a long lifetime while suppressing deterioration of components in the power conversion device due to thermal energy generated in a discharge resistance. In particular, a control circuit substrate controls operation of the semiconductor modules. A discharge resistance substrate is arranged between an outer wall surface of a capacitor module and the control circuit substrate, and separated from an outer wall surface of the capacitor module and the control circuit substrate in a direction perpendicular to the control circuit substrate.

BRIEF DESCRIPTION OF THE DRAWINGS

A preferred, non-limiting embodiment of the present disclosure will be described by way of example with reference to the accompanying drawings, in which.

DETAILED DESCRIPTION OF THE PREFERRED EMBODIMENTS

Figure 1:
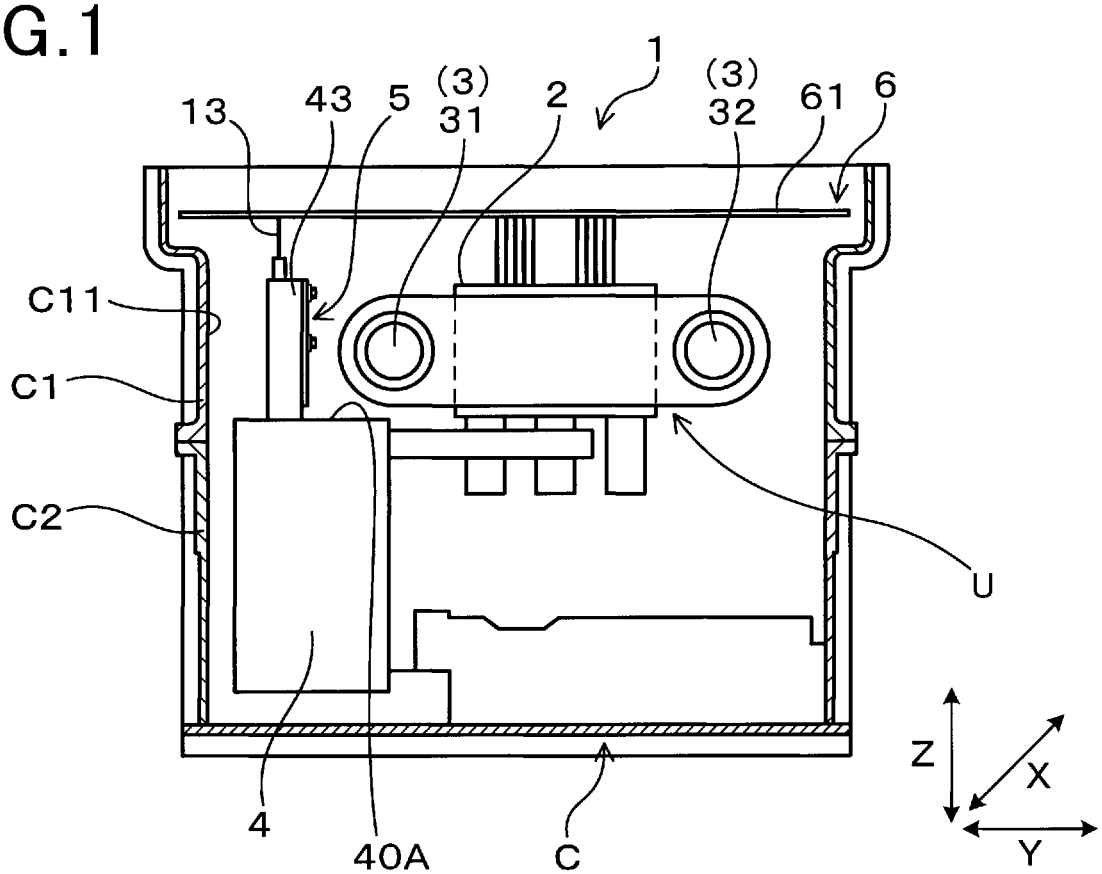
FIG. 1 is a view showing an overall structure of a power conversion device according to an exemplary embodiment of the present disclosure.

Hereinafter, various embodiments of the present disclosure will be described with reference to the accompanying drawings. In the following description of the various embodiments, like reference characters or numerals designate like or equivalent component parts throughout the several diagrams.

EXEMPLARY EMBODIMENT

A description will be given of a power conversion device 1 according to an exemplary embodiment of the present disclosure with reference to FIG. 1 to FIG. 7.

FIG. 1 is a view showing an overall structure of the power conversion device 1 according to the exemplary embodiment of the present disclosure. As shown in FIG. 1, the power conversion device according to the exemplary embodiment has semiconductor modules 2, a cooling unit 3, a capacitor module 4, and a discharge resistance substrate 5, a control circuit substrate 6 and a casing C. The cooling unit 3 cools a temperature of the semiconductor modules 2. The capacitor module 4 is electrically connected to the semiconductor modules 2. Electrical charge accumulated in the capacitor module 4 are discharged through discharge resistances 51 arranged on the discharge resistance substrate 5. The control circuit substrate 6 controls the operation of the semiconductor modules 2. The casing C accommodates the semiconductor modules 2, the cooling unit 3, the capacitor module 4, the discharge resistance substrate 5 and the control circuit substrate 6.

Figure 2:
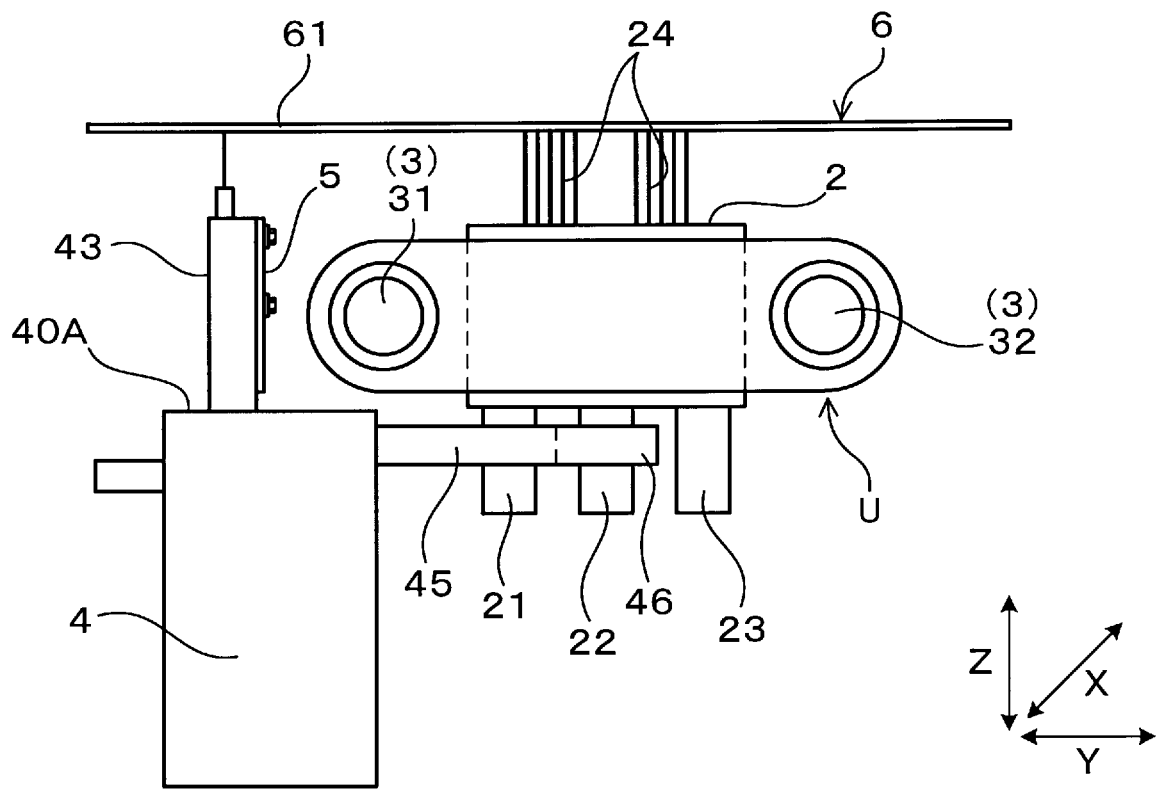
FIG. 2 is a view showing a schematic structure of a main part of the power conversion device along a width direction of a capacitor module according to the exemplary embodiment shown in FIG. 1.
Figure 3A:
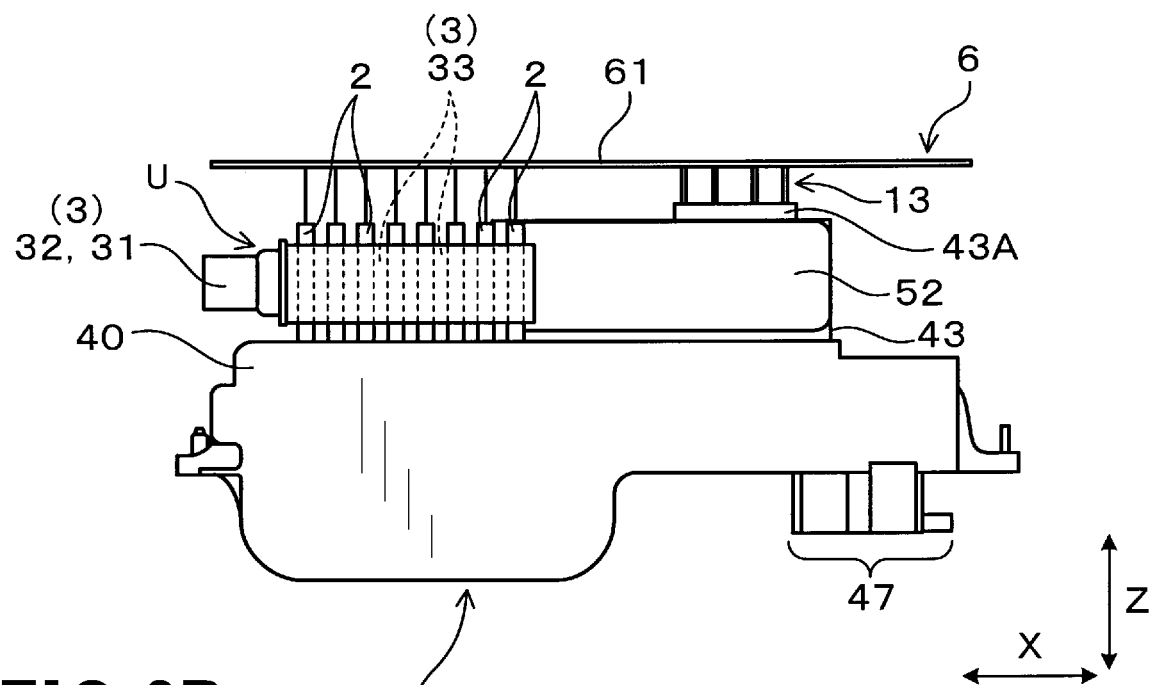
FIG. 3A and FIG. 3B are views showing a schematic structure of a main part of the power conversion device along a longitudinal direction of the capacitor module according to the exemplary embodiment shown in FIG. 1.
Figure 3B:
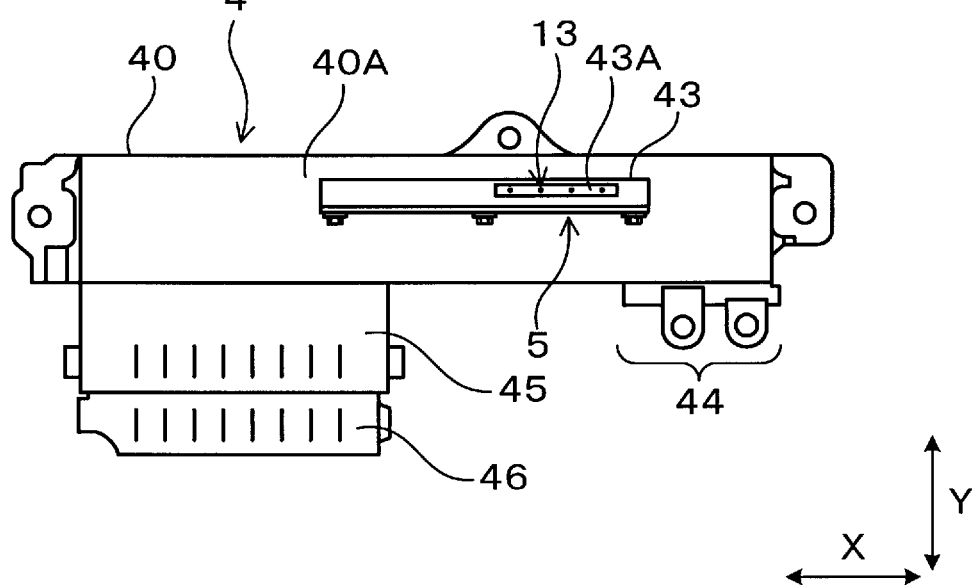

FIG. 2 is a view showing a schematic structure of a main part of the power conversion device 1 along a width direction of the capacitor module 4 according to the exemplary embodiment shown in FIG. 1. FIG. 3A and FIG. 3B are views showing a schematic structure of the main part of the power conversion device 1 along a longitudinal direction of the capacitor module 4 according to the exemplary embodiment shown in FIG. 1.

As shown in FIG. 2, FIG. 3A and FIG. 3B, the discharge resistance substrate 5 is arranged between the control circuit substrate 6 and a top wall surface 40A of the capacitor module 4 so as to be separated from both the top wall surface 40A and the control circuit substrate 6. The top wall surface 40A is one of the outer wall surfaces of the capacitor module 4. Further, as shown in FIG. 1 and FIG. 2, the discharge resistance substrate 5 is arranged in the direction perpendicular to the control circuit substrate 6 in the casing C.

As shown in FIG. 1, the discharge resistance substrate 5 is arranged parallel to an inner wall surface C11 of the casing C between the casing C and the cooling unit 3. As shown in FIG. 1, FIG. 2, and FIG. 3A, the cooling unit 3 is arranged between the capacitor module 4 and the control circuit substrate 6.

Figure 4:
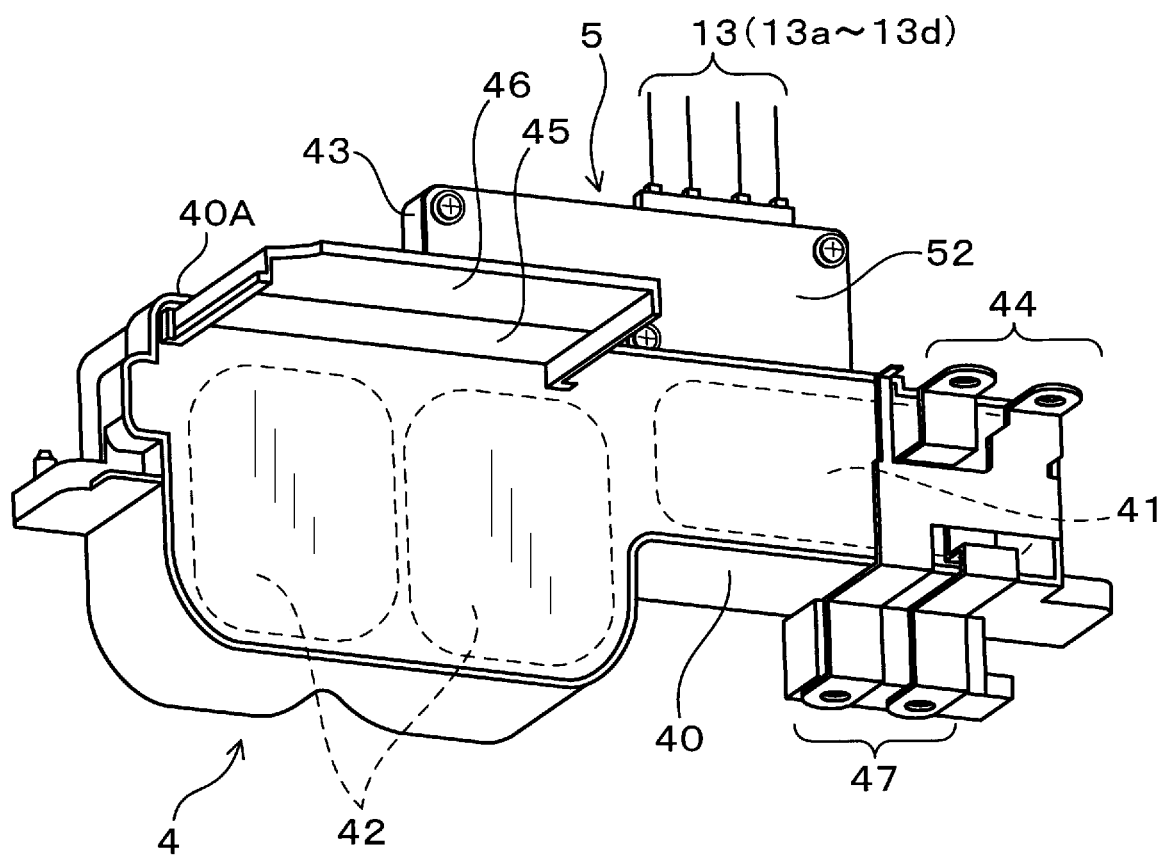
FIG. 4 is a perspective view showing a structure of the main part of the power conversion device according to the exemplary embodiment shown in FIG. 1.

FIG. 4 is a perspective view showing a structure of the main part of the power conversion device 1 according to the exemplary embodiment shown in FIG. 1.

As shown in FIG. 4, the capacitor module 4 accommodates a filter capacitor 41, a smoothing capacitor 42. A capacitor casing 40 accommodates the capacitor module 4. The capacitor casing 40 forms the top wall surface 40A. Each of the filter capacitor 41 and the smoothing capacitor 42 smoothes a current.

The discharge resistance substrate 5 is attached to a substrate fixing part 43 which projects from the top wall surface 40A to outside of the capacitor casing 40.

The power conversion device 1 according to the exemplary embodiment further has voltage detection terminals 13 (13a to 13d). The voltage detection terminals 13 are electrically connected to the capacitor module 4. A detection signal of the capacitor voltage is transmitted to the control circuit substrate 6 through the voltage detection terminals 13. As shown in FIG. 3B, the voltage detection terminals 13 are arranged parallel to the discharge resistance substrate 5 between the discharge resistance substrate 5 and the control circuit substrate 6.

In the structure of the power conversion device 1 according to the exemplary embodiment shown in FIG. 1, FIG. 2, FIG. 3A, FIG. 3B and FIG. 6, the Z axis direction (Z direction) corresponds to a longitudinal direction of the discharge resistance substrate 5 (e.g. which corresponds to the vertical direction shown in FIG. 3A). The discharge resistance substrate 5 is arranged extending to a vertical direction to the control circuit substrate 6. For example, the horizontal direction in FIG. 3A and FIG. 3B, the X axis direction (X direction) is perpendicular to the Z direction, and corresponds to a longitudinal direction of each of the semiconductor modules 2 and the capacitor module 4 (40). The Y direction corresponds to a width direction of each of the semiconductor modules 2 and the capacitor module 4. The Y direction corresponds to the vertical direction in FIG. 3B.

A description will now be given of a detailed structure of each component and a detailed circuit structure forming the power conversion device 1 according to the exemplary embodiment with reference to FIG. 5.

Figure 5:
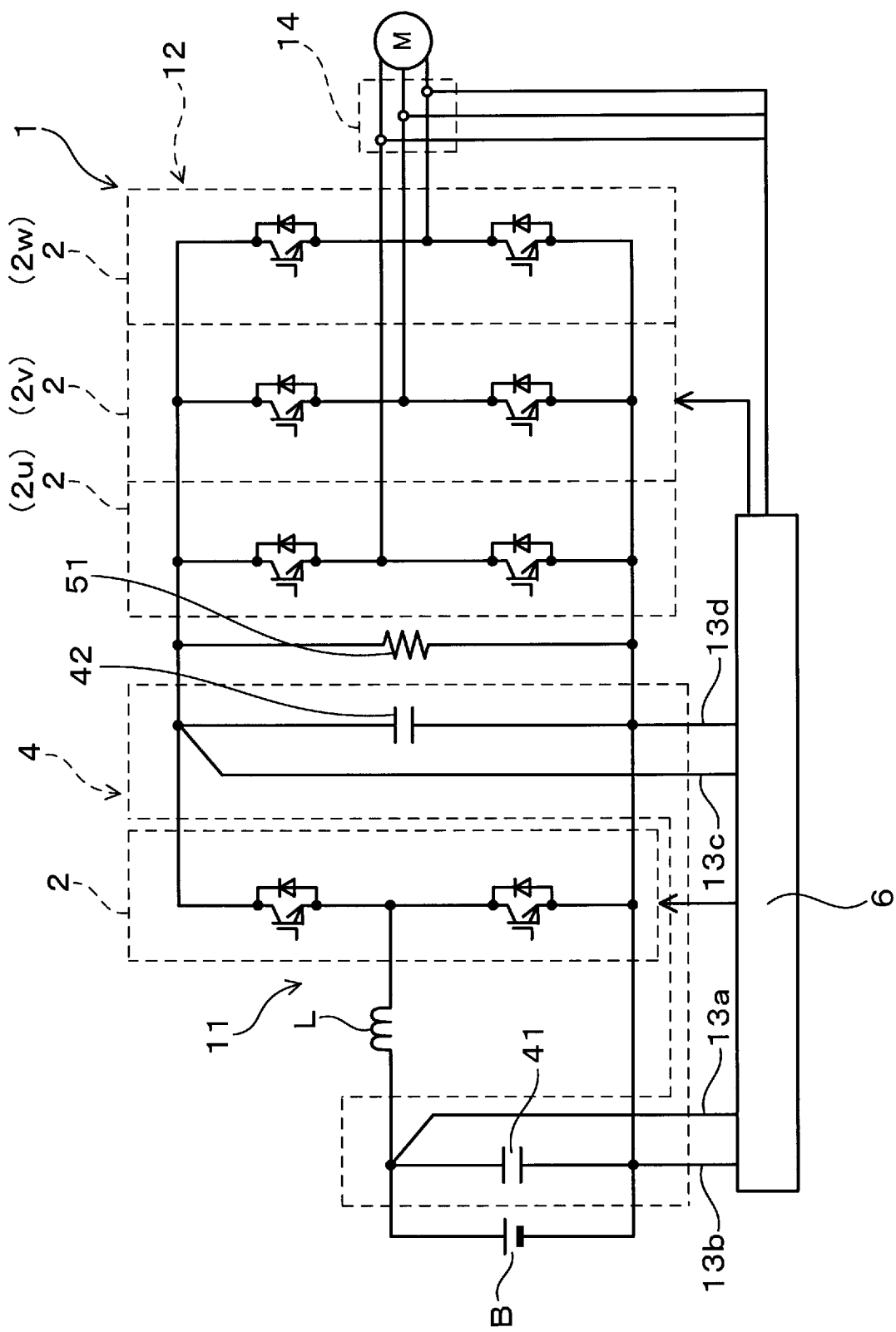
FIG. 5 is a view showing a power conversion circuit in the power conversion device according to the exemplary embodiment shown in FIG. 1.

FIG. 5 is a view showing a power conversion circuit in the power conversion device 1 according to the exemplary embodiment shown in FIG. 1. As shown in FIG. 5, the power conversion device 1 according to the exemplary embodiment is equipped with a boost converter 11 and an alternating current (AC) inverter 12. The boost converter 11 boosts a high direct current power (DC power) of a battery B, and the AC inverter 12 converts the boosted DC power to a three phase alternating current power (3 phase AC power) of a U phase, V phase and W phase.

For example, the power conversion device 1 according to the exemplary embodiment is applied to hybrid vehicles, electronic vehicles, etc. so as to supply AC power to a drive motor M of a vehicle.

The filter capacitor 41 is arranged at the input side of the boost converter 11. The smoothing capacitor 42 is arranged at the output side of the boost converter 11. The filter capacitor 41 smoothes an input current supplied from the battery B to the boost converter 11 so as to suppress variation of the input current. The smoothing capacitor 42 smoothes a boosted input current supplied from the boost converter 11 to the AC inverter 12 so as to suppress variation of this current.

As shown in FIG. 5, the discharge resistance 51 is arranged parallel to the smoothing capacitor 42. The discharge resistance 51 discharges electrical charge accumulated in the smoothing capacitor 42 during a period when the power conversion device 1 stops, etc.

For example, the battery B is an on-vehicle battery composed of a lithium-ion battery. The boost converter 11 is composed of a boost reactor L and the semiconductor modules 2. The AC inverter 12 is composed of three phase semiconductor modules 2 (i.e. 2U, 2V and 2W). Each semiconductor module 2 has two switching elements connected in series as an upper arm and a lower arm.

When receiving control signals transmitted from the control circuit substrate 6, the switching elements in the three phase semiconductor modules 2 are turned on/off.

Each of the switching elements in the three phase semiconductor modules 2 is composed of one of an Insulated Gate Bipolar Transistor (IGBT), a metal oxide semiconductor field effect transistor (MOS FET), etc. A diode is arranged parallel to the respective switching element.

As shown in FIG. 5, a positive electrode terminal of the filter capacitor 41 is connected to a voltage detection terminal 13a, and a negative electrode terminal of the filter capacitor 41 is connected to a voltage detection terminal 13b. A positive electrode terminal of the smoothing capacitor 42 is connected to a voltage detection terminal 13c, and a negative electrode terminal of the smoothing capacitor 42 is connected to a voltage detection terminal 13d.

The voltage detection terminals 13a to 13d are connected to the control circuit substrate 6. The voltage detection signals are transmitted to the voltage detection circuit 6 mounted on the control circuit substrate 6 through the voltage detection terminals 13a to 13d. A current sensor 14 is arranged at the output side of the AC inverter 12. The current sensor 4 detects an output current of each of the U phase, the V phase and the W phase of the AC inverter 12, and transmits the detection signals to the control circuit substrate 6.

Figure 6:
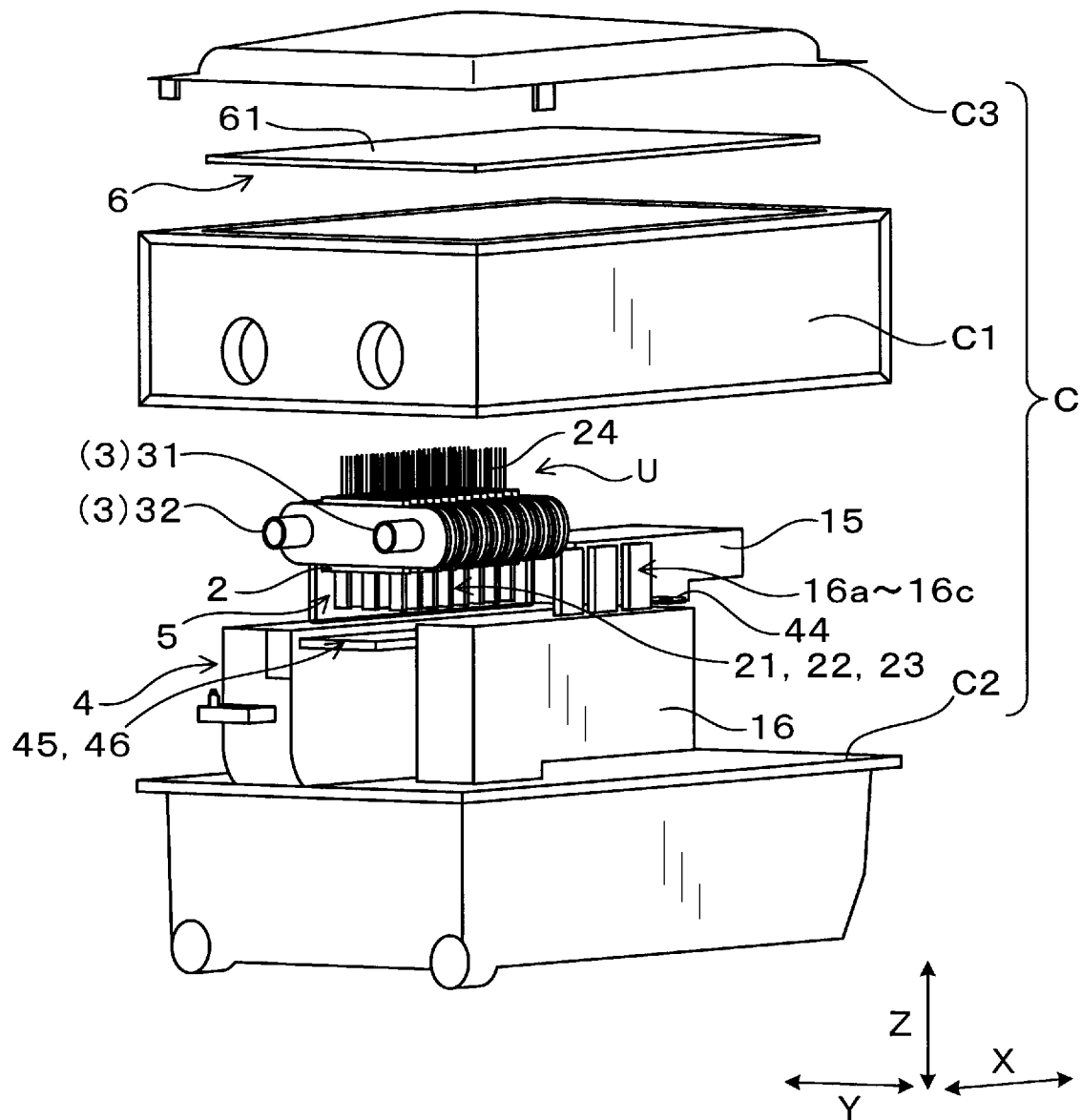
FIG. 6 is an exploded perspective view showing an overall structure of the power conversion device according to the exemplary embodiment shown in FIG. 1.

FIG. 6 is an exploded perspective view showing an overall structure of the power conversion device 1 according to the exemplary embodiment shown in FIG. 1.

As shown in FIG. 6, the casing C is composed of three parts divided along the Z direction. That is, the casing C is composed of a first casing C1 having a substantial rectangular cylindrical shape, a second casing C2 having a substantial rectangular vessel, and a cover casing cap C3 having a substantial plate shape. The second casing C2 is fitted with an opening part at one end side of the first casing C1, at the bottom side of the first casing C1 in the Z direction. The cover casing cap C3 is fitted with an opening part at one end side of the second casing C2, at the upper side of the second casing C2 in the Z direction. For example, the first casing c1m the second casing C2 and the cover casing cap C3 are assembled together to form the casing C having a box shape.

The first casing C1 accommodates a power unit U and an input terminal base 15. That is, the power unit U and the input terminal base 15 are arranged in the inside of the first casing C1.

The semiconductor modules 2 and the cooling unit 3 are assembled together in the power unit U. In the Z direction shown in FIG. 6, the control circuit substrate 6 is arranged between the power unit U and the cover casing cap C3 so that a substrate surface 61 of the control circuit substrate 6 has a flat surface substantially parallel to a flat top surface of the cover casing cap C3 and the bottom surface of the second casing C2.

The capacitor module 4, an output terminal base 16, a reactor L (not shown), etc. are arranged in the inside of the second casing C2.

As shown in FIG. 4, the capacitor casing 40 forms the outer wall surfaces of the capacitor module 4. The capacitor casing 40 accommodates the filter capacitor 41 and the smoothing capacitor 42. The capacitor casing 40 accommodating the filter capacitor 41 and the smoothing capacitor 42 is filled with an insulation resin, for example, so as to seal the capacitor casing 40. In the exemplary embodiment shown in FIG. 4, the filter capacitor 41 is composed of a single capacitor element, and the smoothing capacitor 42 is composed of two capacitor elements.

As shown in FIG. 4, the capacitor casing 40 has the substrate fixing part 43 on which the discharge resistance substrate 5 is mounted. The substrate fixing part 43 is located on an outer wall surface of the capacitor casing 40 which corresponds to the top wall surface 40A of the capacitor module 4.

A plurality of discharge resistances 51 (not shown) are arranged on a substrate surface 52 of the discharge resistance substrate 5. For example, each discharge resistance 51 is composed of a chip resistance, etc.

The filter capacitor 41 and the smoothing capacitor 42 are arranged at both end parts of the capacitor casing 40 along the longitudinal direction (i.e., along the X direction) of the capacitor casing 40 so that the filter capacitor 41 is separated from the smoothing capacitor 42.

Input bus bars 44 and connection bus bars 47 are attached to the outer wall surface of the capacitor casing 40 at the filter capacitor 41 side. A positive electrode side bus bar 45 and a negative electrode side bus bar 46 are mounted to the outer surface of the capacitor casing 40 at the smoothing capacitor 42 side.

The input bus bars 44, the positive electrode side bus bar 45 and the negative electrode side bus bar 46 are arranged onto the same surface, viewed from the top wall surface 40A of the capacitor casing 40. The substrate fixing part 43 is arranged substantially at the central part of the top wall surface 40A. It is acceptable to rearrange them according to a demand.

As shown in FIG. 3A and FIG. 3B, the input bus bars 44 are arranged extending from the top wall surface 40A of the capacitor casing 40 toward the Y direction. The input bus bars 44 are connected to the input terminal base 15 (see FIG. 6).

The positive electrode side bus bars 45 and the negative electrode side bus bar 46 are arranged extending toward the X direction and parallel with each other near the side of the top wall surface 40A. The positive electrode side bus bars 45 and the negative electrode side bus bar 46 are arranged facing the power unit U arranged at the top side in the Z direction.

The positive electrode side bus bars 45 and the negative electrode side bus bar 46 are connected by welding, etc. with a positive electrode terminal 21 (see FIG. 2) and a negative electrode terminal 22 (see FIG. 2) of the semiconductor modules 2 in the power unit U.

The positive electrode side bus bars 45 and the negative electrode side bus bar 46 are connected respectively to a positive electrode terminal and a negative electrode terminal of the discharge resistance 51.

The connection bus bars 47 are connected to output terminals (not shown) of a reactor L (not shown), which extend in the Z direction from an outer wall surface, which is opposite to the input terminal side of the capacitor casing 40.

The power unit U is composed of the semiconductor modules 2 and cooling pipes 33 having a flat shape, which are alternately stacked in the X direction. Both sides of the cooling pipes 33 are connected to a pair of cooling pipes 31 and 32. The cooling pipes 31 and 32 are arranged parallel with each other in the Y direction. The cooling pipes 33 and the cooling pipes 31 and 32 form the cooling unit 3.

The semiconductor modules 2 accommodates a plurality of the switching elements arranged on a main body part having a flat shape stacked with the cooling pipes 33. The semiconductor modules 2 have alternating current terminals 23 and the positive electrode terminal 21 and the negative electrode terminal 22 projecting in the Z direction.

As shown in FIG. 2, the semiconductor modules 2 are connected to the control circuit substrate 6 through control terminals 24 which project in the Z direction.

Figure 7:
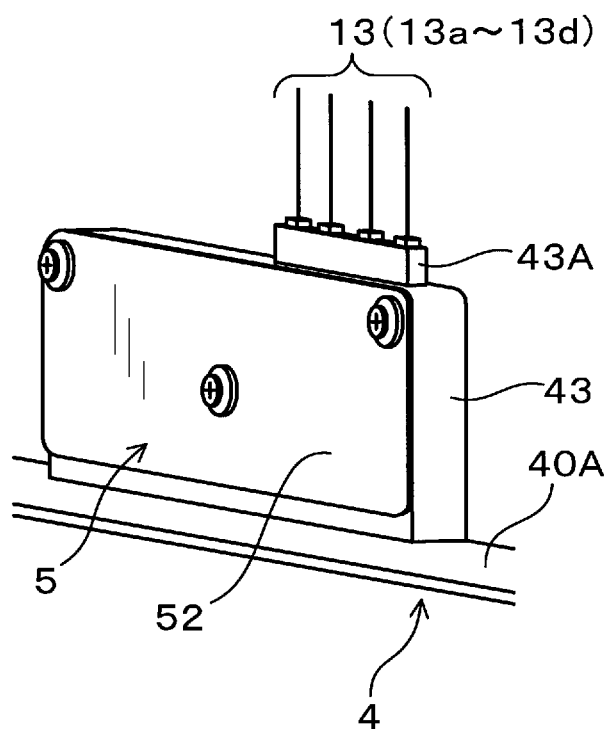
FIG. 7 is a view showing a structural example of mounting a discharge resistance substrate onto the capacitor module in the power conversion device according to the exemplary embodiment shown in FIG. 1.

FIG. 7 is a view showing a structural example of mounting the discharge resistance substrate 5 onto the capacitor module 4 in the power conversion device 1 according to the exemplary embodiment shown in FIG. 1.

As shown in FIG. 7, the substrate fixing part 43 has a flat shaped casing perpendicularly arranged on the top wall surface 40A of the capacitor module 4. The discharge resistance substrate 5 is arranged to cover the opening part of the flat shaped casing of the substrate fixing part 43. The discharge resistance substrate 5 is fixed to the substrate fixing part 43 by using bolts. The case shown in FIG. 7 uses three bolts to fix the discharge resistance substrate 5 onto the capacitor module 4.

A terminal support part 43A is arranged to a side surface of the substrate fixing part 43 in the capacitor module 4 so as to support the voltage detection terminals 13a to 13d. The voltage detection terminals 13a to 13d are signal pins through which a high voltage is supplied to the boost converter 11 and the AC inverter 12. The voltage detection terminals 13a to 13d are connected to the positive electrode side bus bar 45, the negative electrode side bus bar 46 and the input bus bars 44. Further, the voltage detection terminals 13a to 13d extend in the Z direction to be connected to the control circuit substrate 6 (see FIG. 2).

The substrate fixing part 43 and the top wall surface 40A of the capacitor casing 40 are assembled together. It is also acceptable to fix the substrate fixing part 43 to the capacitor casing 40 to be assembled together. It is possible to easily mount the substrate fixing part 43 on the outer wall surface of the capacitor casing 40. This makes it possible to arrange the discharge resistance substrate 5 to a necessary area in the casing C.

The concept of the present disclosure does not limit the arrangement and shape of the discharge resistance substrate 5 previously described. It is acceptable to adjust the arrangement and shape of the discharge resistance substrate 5 according to a size of an interior chamber of the casing C and a relationship in arrangement between the power unit U, the capacitor module 4, and the control circuit substrate 6 accommodated in the casing C. It is also acceptable to adjust the arrangement and shape of the substrate fixing part 43 according to the size of the interior chamber of the casing C and the relationship in arrangement between the power unit U, the capacitor module 4, and the control circuit substrate 6 accommodated in the casing C.

In the structure shown in FIG. 3A and FIG. 3B, it is acceptable for each of the discharge resistance substrate 5 and the substrate fixing part 43 to have a flat rectangle shape extending in a lateral direction according to a height of the power unit U. It is also acceptable for each of the discharge resistance substrate 5 and the substrate fixing part 43 to have a substantial flat square shape extending in the lateral direction according to the height of the power unit U.

It is acceptable to adjust the attachment position of the substrate fixing part 43 to the top wall surface 40A of the capacitor module 4 to be near the central part close to the position of the power unit U, for example, according to a size of the chamber in the casing C. It is also acceptable to arrange the substrate fixing part 43 at the end part of the top wall surface 40A of the capacitor module 4.

In the structure of the casing C shown in FIG. 6, the capacitor module 4, the input terminal base 15 and the output terminal base 16 are arranged around the power unit U.

The pair of cooling pipes 31 and 32 forming the cooling unit 3 are connected to an external coolant recirculate unit so as to recirculate a coolant. The coolant cools the semiconductor modules 2. That is, the coolant reduces a temperature of the semiconductor modules 2 and surrounding elements thereof. One of the cooling pipes 31 and 32 is an inlet pipe through which the coolant is introduced into the power conversion device 1 according to the exemplary embodiment. The other cooling pipe is an outlet pipe through which the coolant is discharged and recirculated.

The input terminal base 15 is connected to an external battery B through wirings (not shown) so as to supply electric power to the power conversion circuit. The output terminal base 16 has output terminals 16a to 16c connected to wirings (not shown) through which the three phase AC power converted by the power conversion circuit is supplied to the motor M.

The output terminal base 16 is equipped with a current sensor 14 capable of detecting an output current of each of the U phase, V phase and W phase. The current sensor 14 is connected to the control circuit substrate 6.

As shown in FIG. 1, the first casing C1 is arranged facing the second casing C2, and the first casing C1 and the second casing C2 are fixed together through each flange part by using bolts. In this structure, the capacitor module 4 is arranged close to the bottom wall side and the side wall of the second casing C2. The substrate fixing part 43 and the discharge resistance substrate 5 project in the Z direction and are arranged in the inside of the first casing C1.

The substrate fixing part 43 is arranged parallel with the inner wall surface C11 of the casing C. The discharge resistance substrate 5 is arranged at the inside of the substrate fixing part 43 and parallel with the substrate fixing part 43 so that the discharge resistance substrate 5 faces the cooling pile 31 of the power unit U.

A description will now be given of operation and effects of the power conversion device 1 having the structure previously described.

In the structure of the power conversion device 1 previously described, the substrate surface 52 of the discharge resistance substrate 5 is arranged independently and separate from the top wall surface 40A of the capacitor module 4 and the substrate surface 61 of the control circuit substrate 6 so that the substrate surface 52 is arranged extending perpendicularly to each of the top wall surface 40A and the substrate surface 61. This structure makes it possible to separate the discharge resistances 51 mounted on the discharge resistance substrate 5 from the capacitor elements in the capacitor modules 4 while electrically insulated from each other. It is accordingly possible to suppress a temperature rise of the capacitor elements due to thermal energy of the discharge resistances 51, and suppress deterioration of the capacitor elements and to achieve a long life of the capacitor elements and the power conversion device 1.

In the power conversion device 1 according to the exemplary embodiment, because the discharge resistance substrate 5 supported by the substrate fixing part 43 is arranged between the inner wall surface C11 of the casing C and the power unit U parallel with the inner wall surface C11 and the power unit U, this structure makes it possible to effectively use a gap in the casing C.

Further, because the discharge resistance substrate 5 is arranged close to the inner wall surface C11 of the casing C, it is possible to enhance a thermal energy discharging capability through the casing C. Because the discharge resistance substrate 5 is arranged at the side of the cooling pipes 31 and 32 in the power unit U, this arrangement makes it possible to improve the cooling effect. It is accordingly to easily discharge thermal energy generated from the discharge resistances 51, and to suppress a temperature of the capacitor elements from increasing, Because the cooling unit 3 of the power unit U is arranged between the capacitor module 4 and the control circuit substrate 6, this structure makes it possible to arrange the discharge resistance substrate 5 closet to the casing C and the cooling unit 3. This structure makes it possible to easily discharge thermal energy generated by the discharge resistances 51 and to enhance the temperature rise of the capacitor elements.

In the power conversion device 1 according to the exemplary embodiment, because the discharge resistance substrate 5 is supported by the substrate fixing part 43, this structure makes it possible to fix the discharge resistance substrate 5 to a desired position in the casing C. Because the substrate fixing part 43 is arranged at the top wall surface 40A of the capacitor module 4, this structure allows the discharge resistance substrate 5 to be easily insulated from the inner wall surface C11 of the casing C and the cooling unit 3.

Further, because the voltage detection terminals 13a to 13d are arranged along the extending direction of the discharge resistance substrate 5 and the terminal support part 43A which supports the voltage detection terminals 13a to 13d, is arranged on the side surface of the substrate fixing part 43, this structure makes it possible to easily arrange the discharge resistance substrate 5 and the voltage detection terminals 13a to 13d in the casing C.

This structure makes it possible to effectively use the interior area of the casing C while considering the volume of the casing C.

In the power conversion device 1 according to the exemplary embodiment having the structure previously described, when receiving control signals transmitted from the control circuit substrate 6, the semiconductor modules 2 forming the boost converter 11 are driven so as to boost a DC voltage of the battery B. The input voltage as the DC voltage of the battery B and boosted voltage are detected through the voltage detection terminals 13. In order to obtain a desired boosted voltage, the switching elements in the semiconductor modules 2 are turned on/off on the basis of the control signals control signals transmitted from the control circuit substrate 6. A current flowing between the battery B and the boost converter 11 varies due to the switching operation of the switching elements in the semiconductor modules 2. The filter capacitor 41 smoothes the variation of the current flowing between the battery B and the boost converter 11.

The control circuit substrate 6 performs feedback control of the results of the turning on/off operation of the switching elements in each phase on the basis of a current detected by the current sensor 14 and a frequency of the detected current. The smoothing capacitor 42 smoothes a current variation after the DC voltage has been boosted by the switching operation of the switching elements.

On the other hand, when an ignition switch (not shown) is turned off and the power conversion device 1 stops operating, electrical charge accumulated in the filter capacitor 41 and the smoothing capacitor 42 in the capacitor module 4 are discharged to a safe voltage through the discharge resistances 51.

Because the power conversion device 1 according to the exemplary embodiment has the improved structure previously described, thermal energy generated by the discharge resistances 51 are effectively discharged outside through the casing C.

The reduction of a thermal energy receiving area of the capacitor module 4 makes it possible to suppress a temperature rise of the capacitor elements. This allows the capacitor module 4 to be protected without increasing of the overall size of the capacitor modules 4 and allows the power conversion device 1 to have a long lifetime and a compact size.

Incidentally, for example, there is a related art which discloses a structure of a capacitor module, to be used in a vehicular power conversion device, having a first circuit substrate and a second circuit substrate. A control circuit is mounted on a capacitor casing. A voltage detection circuit for detecting a voltage of the capacitor is arranged on the second circuit substrate. The first circuit substrate and the second circuit substrate are separately arranged. For example, the second circuit substrate is mounted on a side wall of the casing, and the first circuit substrate is mounted on another side wall of the casing. The second circuit substrate is separated from the first circuit substrate in the capacitor module. This structure allows the first circuit substrate to have no insulation pattern, and reduces the size of the capacitor module and as a result to reduce the overall size of the power conversion device. A discharge resistance is mounted on the second circuit substrate so that the discharge resistance is arranged parallel to the capacitor. Electrical charge accumulated in the capacitor are discharged through the discharge resistance. For example, when an ignition of a vehicle is turned off, the internal electrical charge in the capacitor is gradually discharged through the discharge resistance. This allows a user to safety perform replacement of the inverter with a new inverter.

Because of converting electric energy to thermal energy, the discharge resistance always operates at a high temperature. Accordingly, the structure of the power conversion device disclosed in the related art previously described causes a drawback. That is, because the second circuit substrate on which the discharge resistance is mounted is arranged facing the side surface of the casing on which the capacitor is mounted, and the capacitor element is arranged near the discharge resistance, the capacitor element receives a large amount of thermal energy generated by the discharge resistance. This causes deterioration of the capacitor element and reduces the lifetime of the capacitor element.

On the other hand, the power conversion device according to the exemplary embodiment of the present disclosure, previously described in detail, has the improved structure in which the control circuit substrate and the discharge resistance substrate having the discharge resistance are provided independently. Further, the discharge resistance substrate is arranged between the control circuit substrate and the capacitor module in a direction perpendicular to the control circuit substrate. This improved arrangement of the power conversion device makes it possible to reduce the overall size of the control circuit module and accommodate them in the casing with a compact size while maintaining the electrical connection between the control circuit substrate, the capacitor module and the discharge resistance substrate.

Further, because the discharge resistance substrate is arranged separate from the capacitor module and the control circuit substrate, this arrangement makes it possible to reduce influence of thermal energy generated in the discharge resistance as small as possible. Accordingly, it is possible for the improved structure of the power conversion device previously described to suppress a temperature of a capacitor element in the capacitor module from increasing and to prevent deterioration of the capacitor element due to thermal energy generated in the discharge resistance.

The power conversion device having the improved structure previously described makes it possible to suppress deterioration of various components including the capacitor element due to the thermal energy generated in the discharge resistance, and to have a long lifetime while maintaining a compact structure thereof.

While specific embodiments of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present disclosure which is to be given the full breadth of the following claims and all equivalents thereof.

What is claimed is:

1. A power conversion device comprising:
semiconductor modules forming a power conversion circuit;
a cooling unit cooling a temperature of the semiconductor modules;
a capacitor module electrically connected to the semiconductor module;
a discharge resistance substrate on which a discharge resistance is arranged, the discharge resistance discharging electrical charge accumulated in the capacitor module;
a control circuit substrate controlling operation of the semiconductor modules; and
a casing accommodating the semiconductor module, the cooling unit, the capacitor module, the discharge resistance substrate and the control circuit substrate,
wherein the discharge resistance substrate is arranged between an outer wall surface of the capacitor module and the control circuit substrate, the outer wall surface of the capacitor module is an end surface that is closest to the discharge resistance substrate, the outer wall surface of the capacitor module is arranged so as to be opposite in a direction perpendicular to a major surface of the control circuit substrate, and
wherein the discharge resistance substrate is separated from the outer wall surface and the control circuit substrate in a direction perpendicular to the control circuit substrate.

2. The power conversion device according to claim 1, wherein
the discharge resistance substrate is arranged parallel to an inner wall surface of the casing between the casing and the cooling unit.

3. The power conversion device according to claim 2, wherein
the cooling unit is arranged between the capacitor module and the control circuit substrate.

4. The power conversion device according to claim 2, further comprising voltage detection terminals connected to the capacitor module, through which a capacitor voltage is detected, wherein
the voltage detection terminals are arranged parallel to the discharge resistance substrate between the discharge resistance substrate and the control circuit substrate.

5. The power conversion device according to claim 1, wherein
the cooling unit is arranged between the capacitor module and the control circuit substrate.

6. The power conversion device according to claim 1, further comprising voltage detection terminals connected to the capacitor module, through which a capacitor voltage is detected, wherein
the voltage detection terminals are arranged parallel to the discharge resistance substrate between the discharge resistance substrate and the control circuit substrate.

7. A power conversion device comprising:
semiconductor modules forming a power conversion circuit;
a cooling unit cooling a temperature of the semiconductor modules;
a capacitor module electrically connected to the semiconductor module;
a discharge resistance substrate on which a discharge resistance is arranged, the discharge resistance discharging electrical charge accumulated in the capacitor module;
a control circuit substrate controlling operation of the semiconductor modules; and
a casing accommodating the semiconductor module, the cooling unit, the capacitor module, the discharge resistance substrate and the control circuit substrate; and
a capacitor casing which accommodates the capacitor module,
wherein the discharge resistance substrate is arranged between an outer wall surface of the capacitor module and the control circuit substrate, and separated from the outer wall surface and the control circuit substrate in a direction perpendicular to the control circuit substrate,
wherein the capacitor module comprises a filter capacitor and a smoothing capacitor which smooth a current flowing in the power conversion device, and the capacitor casing forms the outer wall surface of the capacitor module, and
wherein the discharge resistance substrate is attached to a substrate fixing part which extends outside from the outer wall surface of the capacitor module.

8. A power conversion device comprising:
semiconductor modules forming a power conversion circuit;
a cooling unit cooling a temperature of the semiconductor modules;
a capacitor module electrically connected to the semiconductor module;
a discharge resistance substrate on which a discharge resistance is arranged, the discharge resistance discharging electrical charge accumulated in the capacitor module;
a control circuit substrate controlling operation of the semiconductor modules; and
a casing accommodating the semiconductor module, the cooling unit, the capacitor module, the discharge resistance substrate and the control circuit substrate; and
a capacitor casing which accommodates the capacitor module,
wherein the discharge resistance substrate is arranged between an outer wall surface of the capacitor module and the control circuit substrate, and separated from the outer wall surface and the control circuit substrate in a direction perpendicular to the control circuit substrate,
wherein the discharge resistance substrate is arranged parallel to an inner wall surface of the casing between the casing and the cooling unit,
wherein the capacitor module comprises a filter capacitor and a smoothing capacitor which smooth a current flowing in the power conversion device, and the capacitor casing forms the outer wall surface of the capacitor module, and
wherein the discharge resistance substrate is attached to a substrate fixing part which extends outside from the outer wall surface of the capacitor module.

* * * * *